United States Patent
Amano et al.

[11] Patent Number: 6,100,112
[45] Date of Patent: Aug. 8, 2000

[54] METHOD OF MANUFACTURING A TAPE CARRIER WITH BUMP

[75] Inventors: Toshiaki Amano, Hiratsuka; Toshiaki Asada, Tokyo; Masakazu Hamada, Fujisawa, all of Japan

[73] Assignee: The Furukawa Electric Co., Ltd., Tokyo, Japan

[21] Appl. No.: 09/167,012

[22] Filed: Oct. 6, 1998

[30] Foreign Application Priority Data

May 28, 1998 [JP] Japan .................................. 10-147753
May 28, 1998 [JP] Japan .................................. 10-147754

[51] Int. Cl.[7] .......................... H01L 21/44; H01L 21/48; H01L 21/50
[52] U.S. Cl. ........................................... 438/106; 438/108
[58] Field of Search ...................................... 438/106, 108

[56] References Cited

U.S. PATENT DOCUMENTS

| | | |
|---|---|---|
| 4,133,935 | 1/1979 | Dawson . |
| 5,135,606 | 8/1992 | Kato et al. . |
| 5,154,341 | 10/1992 | Melton et al. . |
| 5,233,504 | 8/1993 | Melton et al. . |
| 5,686,352 | 11/1997 | Higgins, III . |

FOREIGN PATENT DOCUMENTS 8-064636  3/1996  Japan .

*Primary Examiner*—John F. Niebling
*Assistant Examiner*—Joseph Jones
*Attorney, Agent, or Firm*—Frishauf, Holtz, Goodman, Langer & Chick, P.C.

[57] ABSTRACT

A bump-attached tape carrier for mounting a semiconductor chip on a circuit substrate, the bump-attached tape carrier comprising, an insulating film, a conductor pattern formed on the insulating film, and metal bumps formed on the conductor pattern and adapted to be bonded with the semiconductor chip, wherein the metal bumps are respectively formed of a columnar body having a side wall substantially perpendicular to the conductor pattern.

16 Claims, 7 Drawing Sheets

METHOD OF MANUFACTURING A TAPE CARRIER WITH BUMP

BACKGROUND OF THE INVENTION

This invention relates to a tape carrier provided with bumps (or a bump-attached tape carrier), to the manufacturing method thereof, and to the method of manufacturing a semiconductor device wherein a semiconductor chip is mounted on a bump-attached tape carrier.

In order to meet various needs for an electronic instruments such as the miniaturization, weight-saving, speed-up, improved functionality thereof, etc., various types of semiconductor packages have been developed. As one of such semiconductor-packaging techniques, there has been developed a packaging technique of a so-called tape carrier system wherein a semiconductor chip is bonded via a solder bump to a metal pattern formed on an insulating film, this tape carrier system being especially intended to meet the needs for an increasing number of pins due to an increasing integration of semiconductor chips and for the miniaturization of devices.

One example of packaging techniques utilizing this tape carrier system is disclosed in Japanese Patent Unexamined Publication No. H/8-64636. As shown in FIG. 1, according to this packaging technique, a metal layer 2 is formed on a polyimide tape 1, and solder bumps 3 are formed on the metal layer 2. The solder bumps 3 are then thermally bonded with metal pads 6 formed, in conformity with the solder bumps 3, on one main surface of an electronic device (semiconductor chip) 4. The tape carrier carrying electronic devices 4 in this manner is subsequently cut off to obtain discrete electronic devices.

Since a thin transparent polyimide tape is employed in this tape carrier system, this tape carrier system is advantageous in that any stress to be laid upon the solder-bonded portions can be alleviated even at the occasion of heat cycling and that the solder bumps can be observed from the reverse surface of the tape.

The solder bumps are generally formed by means of a cream solder printing method or a solder ball-transferring method. However, since the solder bumps are adhered on a conductor circuit in a molten state thereof, these solder bumps 3 are forced to be a spherical figuration due to the surface tension acting on the droplet of solder as shown in FIG. 1. This spherical solder bump however gives rise to the problem that when the solder bumps is densified or the distance between solder bumps is shortened, a solder bridge may to be formed as a semiconductor chip is mounted on these solder bumps.

For example, when the bonding height of the solder bumps is set to 50 μm in a solder bump bonding where the solder bumps are formed on a tape at a pitch of 100 μm (50 μm in pad width/50 μm in interval), the diameter of solder bump becomes as large as 70 μm. Therefore, the distance between the solder bumps becomes as short as 30 μm.

When the distance between the solder bumps declines to such an extent in the employment of spherical solder bumps, a solder bridge may be formed as a semiconductor chip is mounted on these solder bumps. Moreover, there is another problem that the charging of an under-fill resin may become difficult.

Further, when a flux is coated on the tape carrier by means of the ordinary method on the occasion of bonding the solder bumps of the tape carrier to the metal pad of a semiconductor chip, not only the solder bumps but also a conductor pattern is covered with the flux, so that the solder may flow out to the conductor pattern on the occasion of fusing the solder. As a result, the height of the bumps may become further lower, thus making it difficult to secure a gap between the semiconductor chip and the tape carrier. Further, the solder may become spherical, thus inviting the formation of a solder bridge as mentioned above.

Additionally, when a flux of high viscosity having a high content of solid matter is employed with a view to temporally fixing a semiconductor chip, a residue of flux may persist between the semiconductor chip and the tape carrier, thus making it necessary to wash out the residue of flux in a subsequent step.

BRIEF SUMMARY OF THE INVENTION

This invention has been made in view of the aforementioned problems and therefore, an object of this invention is to provide a bump-attached tape carrier, which is capable of obviating the formation of a solder bridge between solder bumps even if the pitch of the solder bumps is densified.

Another object of this invention is to provide a method of manufacturing such a bump-attached tape carrier as mentioned above.

Still another object of this invention is to provide a method of manufacturing a semiconductor device exhibiting a high interconnection reliability, which makes it possible to prevent a metal constituting bumps from flowing over a conductor pattern during the fusing of the bumps at the occasion of mounting a semiconductor chip on a tape carrier provided with the bumps, and to perform a bonding between the metal bump of the tape carrier and the metal pad of the semiconductor chip with a high positioning accuracy.

According to a first aspect of this invention, there is provided a bump-attached tape carrier for mounting a semiconductor chip on a circuit substrate, the bump-attached tape carrier comprising an insulating film, a conductor pattern formed on the insulating film, and metal bumps formed on the conductor pattern and adapted to be bonded with the semiconductor chip; wherein the metal bumps are respectively formed of a columnar body having a side wall substantially perpendicular to the conductor pattern.

According to a second aspect of this invention, there is provided a first method of manufacturing a bump-attached tape carrier, which comprises the steps of;

forming a first photosensitive resin layer on a metal foil of a laminate body comprising an insulating film and the metal foil;

forming a first resin pattern for forming a circuit by performing a patterning of the first photosensitive resin layer;

forming a metallic pattern on the metal foil exposed out of the first resin pattern by performing a first electroplating;

forming a second photosensitive resin layer all over a surface including the metal pattern after removing the first resin pattern;

forming a second resin pattern for forming metal bumps by performing a patterning of the second photosensitive resin layer;

forming the metal bumps on the metallic pattern exposed out of the second resin pattern by performing a second electroplating;

removing the second resin pattern; and forming a metal foil pattern by selectively removing the metal foil with the metallic pattern being employed as a mask.

According to a third aspect of this invention, there is provided a second method of manufacturing a bump-attached tape carrier, which comprises the steps of;

forming a first photosensitive resin layer on a metal foil of a laminate body comprising an insulating film and the metal foil;

forming a first resin pattern for forming metal bumps by performing a patterning of the first photosensitive resin layer;

forming metal bumps on the metal foil exposed out of the first resin pattern by performing an electroplating;

forming a second photosensitive resin layer all over a surface including the metal bumps by means of electrodeposition process after removing the first resin pattern;

forming a second resin pattern for forming a circuit by performing a patterning of the second photosensitive resin layer; and forming a metal foil pattern by selectively removing the metal foil with the second resin pattern being employed as a mask.

According to a fourth aspect of this invention, there is provided a method of manufacturing a semiconductor device by bonding a semiconductor chip to a bump-attached tape carrier;

the bump-attached tape carrier comprising an insulating film, a conductor pattern formed on the insulating film, and metal bumps formed on the conductor pattern and adapted to be bonded with the semiconductor chip; the metal bumps being respectively formed of a columnar body having a side wall substantially perpendicular to the conductor pattern; and the method comprising the steps of;

coating a flux on a surface of each electrode of the semiconductor chip or a top surface of each of the metal bumps;

aligning the semiconductor chip with the tape carrier so as to set each electrode of the semiconductor chip to coincide with each of the metal bumps of the tape carrier;

fixing the semiconductor chip to the tape carrier by means of a fixing material; and connecting each electrode of the semiconductor chip with each of the metal bumps of the tape carrier by heat-fusing the metal bumps of the tape carrier.

According to a fifth aspect of this invention, there is provided a method of manufacturing a semiconductor device by bonding a semiconductor chip to a bump-attached tape carrier;

the bump-attached tape carrier comprising an insulating film, a conductor pattern formed on the insulating film, and metal bumps formed on the conductor pattern and adapted to be bonded with the semiconductor chip; the metal bumps being respectively formed of a columnar body having a side wall substantially perpendicular to the conductor pattern; and the method comprising the steps of;

coating a flux on a surface of each electrode of the semiconductor chip or a top surface of each of the metal bumps;

aligning the semiconductor chip with the tape carrier so as to set each electrode of the semiconductor chip in accordance with each of the metal bumps of the tape carrier; and connecting each electrode of the semiconductor chip with each of the metal bumps of the tape carrier by heating a surface of the semiconductor chip which is opposite to the surface thereof where the electrodes are formed by means of a heating tool thereby fusing the metal bumps of the tape carrier.

DETAILED DESCRIPTION OF THE INVENTION

Figure 1:
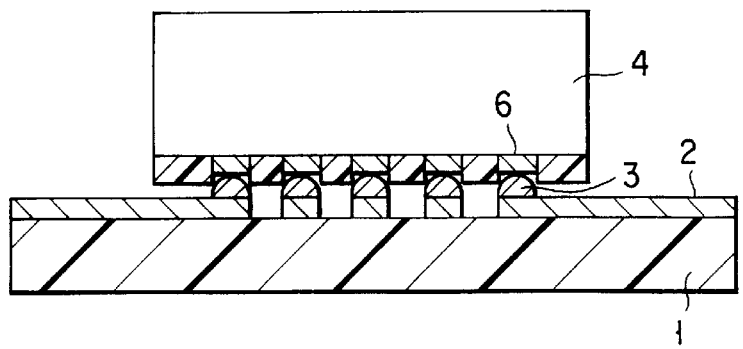
FIG. 1 is a cross-sectional view illustrating a semiconductor package employing a conventional tape carrier.

A bump-attached tape carrier according to a first embodiment of this invention is characterized in that it comprises an insulating film, a conductor pattern formed on the insulating film, and metal bumps formed on the conductor pattern and adapted to be bonded with a semiconductor chip, wherein the metal bumps are respectively formed of a columnar body having a side wall substantially perpendicular to the conductor pattern.

The conductor pattern in this bump-attached tape carrier is provided with a terminal to be connected with a circuit substrate. In this case, a hole having a smaller diameter than that of the terminal of the conductor pattern can be formed in the insulating film disposed below the terminal, and hence a metallic layer can be formed on a metal foil which is exposed in this hole by means of plating, this metallic layer being employed as a connecting electrode. Therefore, by making use of this connecting electrode, the tape carrier can be connected with a circuit substrate. As for the metallic layer, Cu, Ni, Sn, Sn alloys (solder), etc. can be employed.

As for the materials for forming the metal bump, Sn, Sn alloys (solder), etc. can be employed. In particular, a solder is desirable.

Both metal bump and connecting metal layer may be formed of a multi-layered structure. In this case, both metal bump and connecting metal layer may be formed of an uppermost layer consisting of a solder, and an underlying layer consisting of a metal having a melting point higher than that of the solder, such as Cu or Ni.

Since the metal bump is constituted by a columnar body having a side wall substantially perpendicular to the surface of the conductor pattern in the bump-attached tape carrier of this invention which is constructed as mentioned above, it is possible to obviate the formation of solder bridge at the occasion of mounting a semiconductor chip on the tape carrier as seen in the case of the conventional spherical bump, and at the same time, it is possible to easily perform the charging an under-fill resin.

The method of manufacturing a bump-attached tape carrier according to the second embodiment of this invention is characterized in that it comprises the steps of forming a first photosensitive resin layer on a metal foil of a laminate body comprising an insulating film and the metal foil, forming a first resin pattern for forming a circuit by patterning the first photosensitive resin layer, forming a metallic pattern on the metal foil exposed out of the first resin pattern by performing a first electroplating, forming a second photosensitive resin layer all over a surface including the metal pattern after removing the first resin pattern, forming a second resin pattern for forming metal bumps by patterning the second photosensitive resin layer forming the metal bumps on the metallic pattern exposed out of the second resin pattern by performing a second electroplating, removing the second resin pattern, and forming a metal foil pattern by selectively removing the metal foil with the metallic pattern being employed as a mask.

In this manufacturing method of bump-attached tape carrier, a hole having a smaller diameter than that of the terminal of the conductor pattern can be formed in the insulating film prior to the step of forming the first photosensitive resin layer. In this case, a first metal layer can be formed on the metal foil that has been exposed in the hole by making use of a first electroplating, while a second metal layer can be formed on the first metal layer exposed in the hole by making use of a second electroplating. The resultant metal layer of laminate structure consisting of the first metal layer and the second metal layer can be utilized as a connecting electrode.

As for the materials for the metal pattern and for the first metal layer, Sn, Sn alloys (solder), etc. can be employed.

As for the materials for forming the metal bump and the second metal layer, Sn, Sn alloys (solder), etc. can be employed. By the way, the metal for forming the metal pattern and the first metal layer should preferably be higher in melting point than those of the metal bump and the second metal layer.

The formation of aforementioned hole may be performed following the step of forming the metal pattern but prior to the step of forming the metal bumps. In this case, the metal layer for forming the connecting electrode is formed on the metal foil that has been exposed in this hole. As for the materials useful for this metal layer, any material for constituting the metal bump such as Sn, a solder (e.g., Sn alloy), etc. can be employed.

The formation of the hole in the insulating film can be carried out by making use of a laser for instance.

The method of manufacturing a bump-attached tape carrier according to the third embodiment of this invention is characterized in that it comprises the steps of forming a first photosensitive resin layer on a metal foil of a laminate body comprising an insulating film and the metal foil, forming a first resin pattern for forming metal bumps by patterning the first photosensitive resin layer, forming metal bumps on the metal foil exposed out of the first resin pattern by performing an electroplating, forming a second photosensitive resin layer all over a conductive surface including the metal bumps by means of electrodeposition process after removing the first resin pattern, forming a second resin pattern for forming a circuit by patterning the second photosensitive resin layer, and forming a metal foil pattern by selectively removing the metal foil with the second resin pattern being employed as a mask.

In this manufacturing method of a bump-attached tape carrier, a hole having a smaller diameter than that of the terminal of the conductor pattern can be formed in the insulating film prior to the step of forming the first photosensitive resin layer. In this case, a metal layer for constituting a connecting electrode can be formed on the metal foil that has been exposed in the hole in simultaneous with the formation of the metal bumps by making use of an electroplating. As for the materials for this metal layer, any material to be employed for constituting the metal bumps, such as Sn, a solder (e.g., Sn alloy), etc. can be employed.

The application of the aforementioned electroplating may be performed in two or more steps so as to form a multi-layered metal bump and a multi-layered metal layer. The uppermost layer in this case should be constituted by a solder, Sn, etc., suited for the fusion-bonding. While, the underlying layer should be constituted by a metal having a higher melting point than that of the metal constituting the uppermost layer (Cu, Ni, Sn, solder, etc.).

According to the aforementioned two kinds of manufacturing method of the bump-attached tape carrier, a solder resist that has been employed in the conventional method is no more required to be employed, so that the metal bumps are less in height required to be formed. Therefore, the formation of the metal bumps can be easier and can be finished within a shorter period of time, thus making it possible to save the manufacturing cost of the bump-attached tape carrier. Furthermore, although it has been very difficult to form a metal bump on a substrate which has been already finished to manufacture, it has become possible according to this invention to perform the formation of the metal bumps, since the metal bumps can be formed in the process of manufacturing the substrate.

The method of manufacturing a semiconductor device according to the fourth embodiment of this invention is characterized in that it comprises the steps of coating a flux on a surface of each electrode of a semiconductor chip or a top surface of each of metal bumps, aligning said semiconductor chip with a tape carrier so as to set each electrode of the semiconductor chip in accordance with each of the metal bumps of the tape carrier, fixing the semiconductor chip to a tape carrier by means of a fixing material, and connecting each electrode of the semiconductor chip with each of the metal bumps of the tape carrier by heat-fusing the metal bumps of the tape carrier.

The heating for fusing the metal bumps in this manufacturing method of a semiconductor device can be carried out by the following methods.

(1) A surface of the semiconductor chip which is opposite to the surface thereof where the electrodes are formed is heated by making use of a heating tool.

(2) A tap carrier that has been fixed to the semiconductor chip is passed through a heating furnace.

The method of manufacturing a semiconductor device according to the fifth embodiment of this invention is characterized in that it comprises the steps of coating a flux on a surface of each electrode of a semiconductor chip or a top surface of each of metal bumps, aligning the semiconductor chip with a tape carrier so as to render each electrode of the semiconductor chip to coincide with each of the metal bumps of the tape carrier, and bonding each electrode of the semiconductor chip with each of the metal bumps of the tape carrier by heating a surface of the semiconductor chip which is opposite to the surface thereof where the electrodes are formed by means of a heating tool thereby fusing the metal bumps of the tape carrier.

In the aforementioned manufacturing method of a semiconductor device according to this invention, a space formed between the semiconductor chip and the tape carrier is subsequently charged with an under-fill resin. Further, the electrodes of the semiconductor chip are provided thereon with a metal layer which is capable of being bonded to the metal bumps.

On the occasion of mounting the semiconductor chip on the aforementioned tape carrier, the surface of electrodes of the semiconductor chip or the top surface of metal bumps of the tape carrier is selectively coated with a flux. Therefore, even if a solder is fused, a possibility of causing the fused solder to flow out to the conductor pattern of the tape carrier thereby to lower the height of the metal bumps can be minimized. As a result, the conventional treatment using a solder resist for preventing a solder from flowing out to the conductor pattern is no more required to be performed.

Furthermore, since the bump-attached tape carrier is fixed to a semiconductor chip by making use of a fixing material on the occasion of mounting the semiconductor chip on the bump-attached tape carrier, the misregistration of the semiconductor chip can be avoided, so that the bump-attached tape carrier carrying the semiconductor chip thereon can be passed through a heating furnace, or alternatively the bump-attached tape carrier can be bonded to the semiconductor chip by making use of a heating tool.

Alternatively, it is also possible to perform an accurate bonding between the bump-attached tape carrier and the semiconductor chip without generating any misregistration between them by suitably heat-pressing the bump-attached tape carrier and the semiconductor chip to each other after the semiconductor chip is positioned in place on the bump-attached tape carrier, whereby the fixing of them by making use of a fixing material can be omitted. The pressing force in this case should be suitably selected so as to keep a given distance between the bump-attached tape carrier and the semiconductor chip, thus restraining the metal bumps from being completely collapsed.

When this pressing force is suitably controlled, a warp of the tape carrier can be avoided, thus preventing the generation of bonding failure due to the warp, and at the same time, the semiconductor chip can be kept parallel with the tape carrier.

In this case however, the height of the semiconductor chip in relative to the bump-attached tape carrier should be accurately controlled so as to avoid the metal bumps from being excessively collapsed.

Various specific examples of this invention will be explained as follows with reference to drawings.

Figure 2:
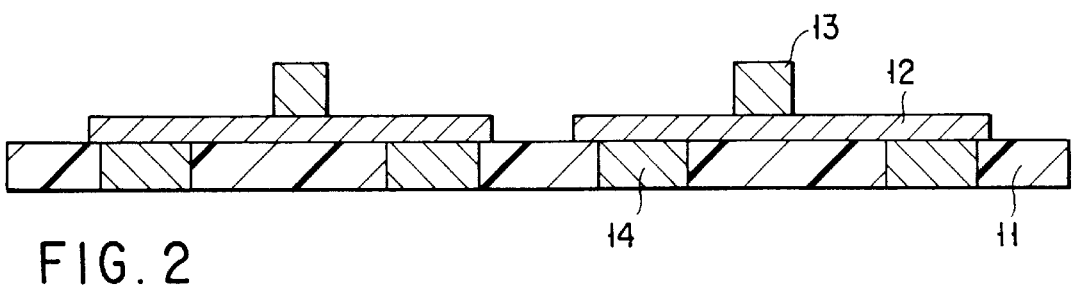
FIG. 2 is a cross-sectional view illustrating a metal bump-attached tape carrier according to one example of this invention.

FIG. 2 shows a cross-sectional view of a metal bump-attached tape carrier according to one example of this invention. Referring to FIG. 2, an insulating film 11 is provided on the surface thereof with a copper pattern 12 on which metal bumps 13 made of a solder, Au, Sn, an Sn alloy, etc. are is formed. The insulating film 11 is also provided, at a portion thereof that is to be bonded to a circuit substrate, with a hole having a smaller diameter than that of the copper pattern 12 (a terminal 51 shown in FIG. 3). This hole is filled with a metal functioning as a connecting electrode 14. This connecting electrode 14 can be formed by means of the plating of copper, nickel, a solder, etc. and is adapted to be connected with a conductor pattern of a circuit substrate via a solder ball or a cream solder that will be fed to the connecting electrode 14.

Figure 3:
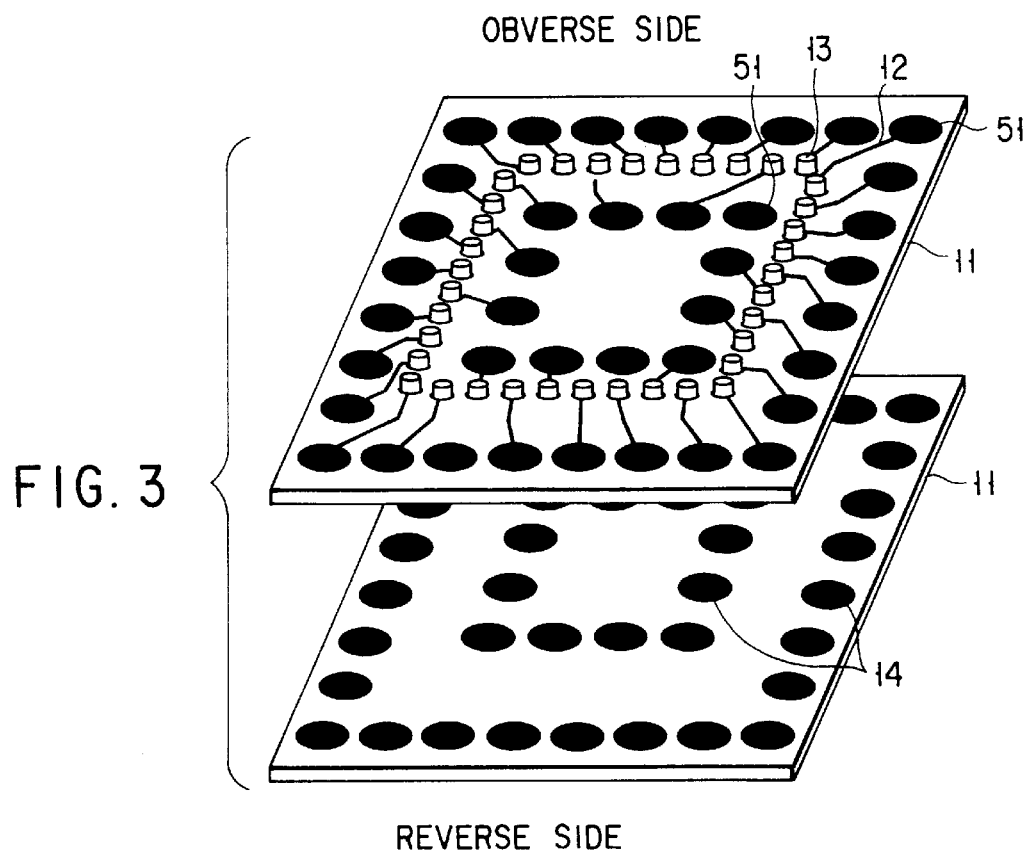
FIG. 3 is a perspective view of a tape carrier according to this invention.

FIG. 3 shows a perspective view of the tape carrier, wherein the upper drawing shows the upper surface of the tape carrier, while the lower drawing shows the reverse surface of the tape carrier. Referring to FIG. 3, the copper pattern 12 comprises terminals 51 which are located at the portions to be electrically connected (in the direction perpendicular to the surface of the copper pattern 12) with the conductor patterns of the circuit substrate. A hole having a smaller diameter than that of the terminal 51 is formed at the portions of the insulating film 11 which are located just below the terminals 51. This hole is filled with a metallic material such a solder, Cu, Ni, Au, Sn alloys, etc. thereby to constitute the connecting electrode 14. A solder ball (not shown) is fed on this connecting electrode 14, and, through this solder ball, the connecting electrode 14 is connected with the conductor pattern of the circuit substrate.

In the metal bump-attached tape carrier constructed as mentioned above, the metal bump 13 is columnar in configuration and the side wall thereof are perpendicular to the surface of the tape carrier. The metal bump 13 may not only be columnar in configuration but also be prismatic having a polygonal cross-section. Since the metal bump 13 is columnar in configuration having perpendicular the side wall as mentioned above, a possibility of forming a bridge between the metal bumps 13 can be minimized even if the pitch of the solder bumps is densified or the distance between solder bumps is shortened, which is in contrast to the conventional tape carrier shown in FIG. 1 where a spherical metal bump is employed. Furthermore, any difficulty of charging an under-fill resin can arise obviated in the case of the tape carrier according to this invention.

Further, since the metal bump is directly formed on the copper pattern without necessitating the formation of a solder resist for preventing the formation of a bridge between the metal bumps, the metal bump is less required in height to be formed. Therefore, the formation of the metal bumps can be easier and can be finished within a short period of time.

Additionally, the thickness of a Cu foil constituting the copper pattern is as thin as 10 to 18 $\mu$m. It is quite conceivable in the case of a structure where this thin copper pattern is contacted with a solder that the copper pattern may be easily fractured as a stress is applied to the copper pattern. However, in the case of a structure where a hole having a smaller diameter than that of the copper pattern 12 (the terminal 51 shown in FIG. 3) is formed at first at the portion of the tape carrier to be connected with a circuit substrate, and then a metal layer is formed by means of plating of Cu, Ni, etc. in this hole, this metal layer acts as a reinforcing member so that the copper pattern can be hardly fractured.

A semiconductor chip (not shown) is then bonded to the tape carrier constructed as mentioned above thereby to obtain a semiconductor package, which is then mounted via the connecting electrodes 14 on a circuit substrate (not shown) thereby to obtain a packaged semiconductor device. In this packaged semiconductor device, a stress generated by a thermal expansion of the circuit substrate can be alleviated owing to a deformation of the tape carrier. As a result, it is now possible to realize a connection between the circuit substrate and the semiconductor chip, which is excellent in reliability and low in manufacturing cost.

Next, a method of manufacturing the aforementioned metal bump-attached tape carrier will be explained. First of all, a first method of manufacturing the metal bump-attached tape carrier by making use of a solder masking method and a method of manufacturing a semiconductor package by making use of this metal bump-attached tape carrier will be explained with reference to FIGS. 4A to 4O illustrating the order of manufacturing steps.

Figure 4A:
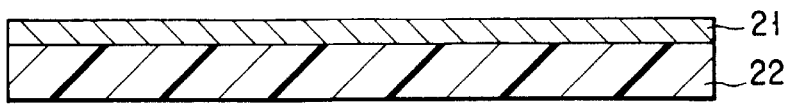
FIGS. 4A to 4O are cross-sectional views illustrating, in sequence, a process of manufacturing a metal bump-attached tape carrier of this invention.
Figure 4B:
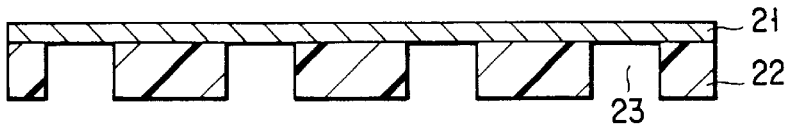

First of all, as shown in FIG. 4A, a material comprising a copper foil 21 having a thickness of 18 μm and a polyimide layer 22 having a thickness of 40 μm and superimposed on the copper foil 21 was prepared. Then, as shown in FIG. 4B, holes 23 each having a diameter of 300 μm and a depth reaching to the surface of the copper foil 21 was formed by means of a carbon dioxide laser at the portions of the polyimide layer 22 where the connecting electrode was to be formed. The carbon that had been adhered to the hole 23 and the vicinity thereof at the occasion of forming the hole 23 was removed mechanically by means of blast treatment.

Figure 4C:
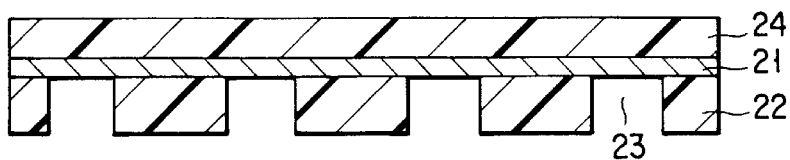
Figure 4D:
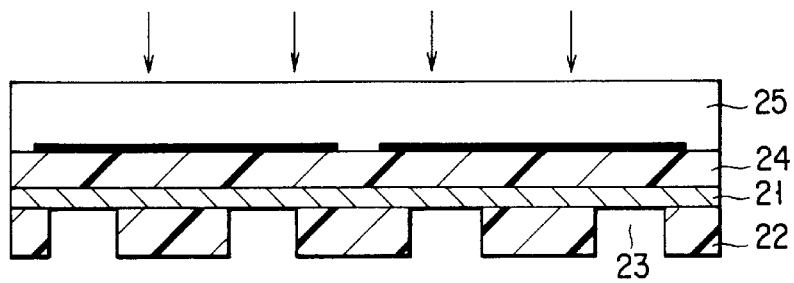

Then, after a negative photosensitive dry film 24 having a thickness of 25 μm was laminated on the copper foil as shown in FIG. 4C, the negative photosensitive dry film 24 was exposed to light through a mask 25 so as to form a positive pattern to be employed as a conductor circuit as shown in FIG. 4D. In this case, an ultra-high pressure mercury lamp was employed as an exposure light source, the exposure dose thereof being set to 80 mJ/cm$^2$.

Figure 4E:
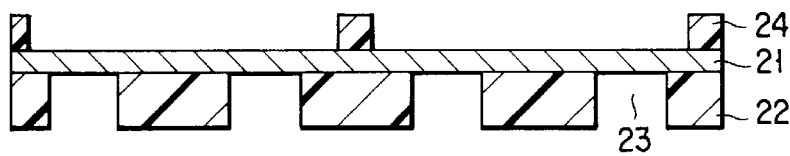

Then, as shown in FIG. 4E, the resultant photosensitive dry film 24 was developed using a 1 wt % aqueous solution of $Na_2CO_3$ 30° C. in liquid temperature thereby to form a plating resist pattern 24.

Figure 4F:
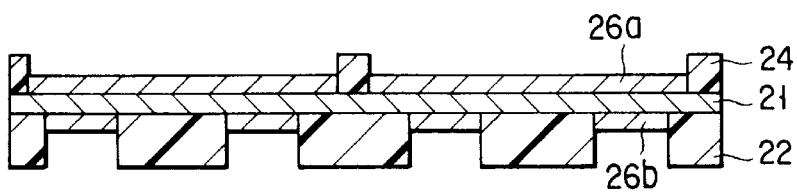

Thereafter, as shown in FIG. 4F, an electroplating of a solder having a composition of 9 tin/1 lead was performed, thereby forming a solder pattern 26a having a thickness of 4 μm and a solder metal layer 26b having a thickness of 4 μm on both sides of the copper foil 21, respectively. The plating bath employed in this case was AS 513 type bath (trade name, Ishihara Yakuhin Co., Ltd.).

Figure 4G:
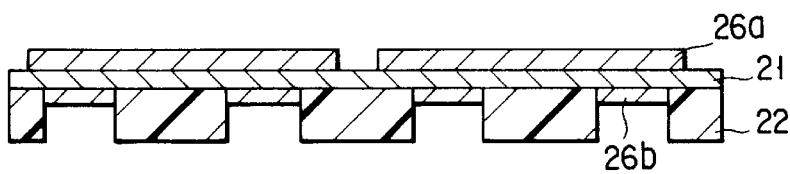
Figure 4H:
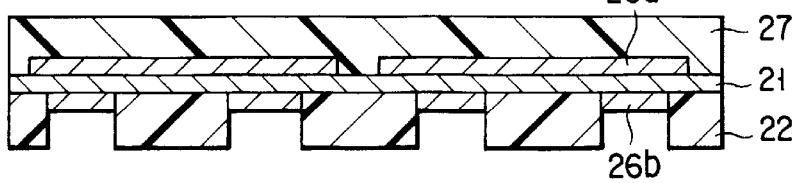

Then, as shown in FIG. 4G, the photosensitive dry film 24 was removed. The remover employed in this case was a 3 wt % aqueous solution of NaOH measuring 45° C. in liquid temperature. Thereafter, as shown in FIG. 4H, a negative photosensitive dry film 27 having a thickness of 50 μm was laminated on the solder pattern 26a.

Figure 4I:
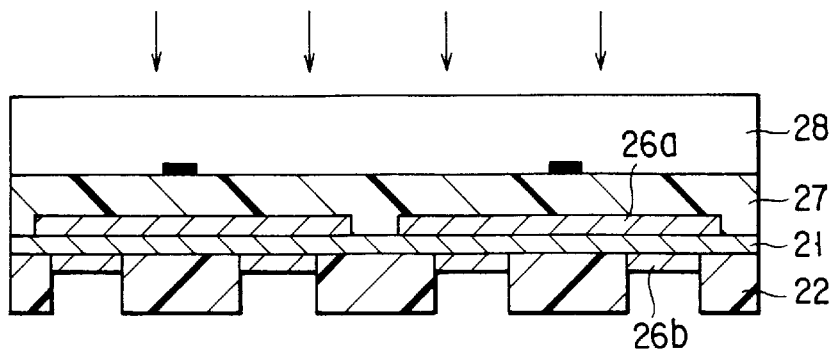
Figure 4J:
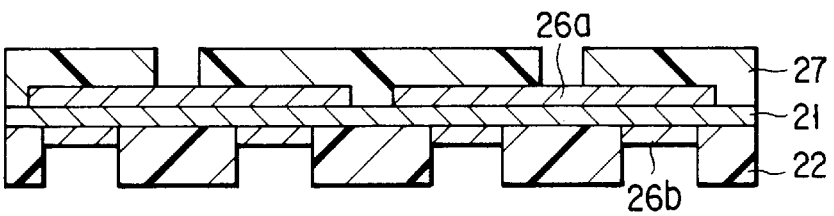

Subsequently, as shown in FIG. 4I, for the purpose of forming a metal bump 29a to be connected with the electrode pad of a semiconductor chip by making use of electroplating method, the photosensitive dry film 27 was exposed to light through a mask 28 so as to form a positive pattern to be employed as a metal bump portion. In this case, an ultra-high pressure mercury lamp was employed as an exposure light source, the exposure dose thereof being set to 160 mJ/cm$^2$. Then, as shown in FIG. 4J, the resultant photosensitive dry film 27 was developed using a 1 wt % aqueous solution of $Na_2CO_3$ measuring 30° C. in liquid temperature.

Figure 4K:
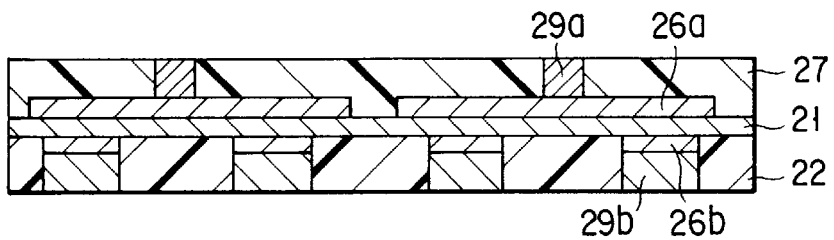
Figure 4L:
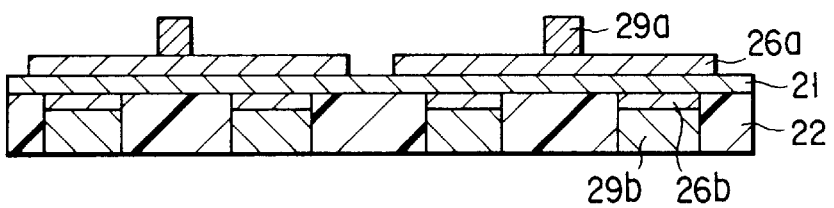

Thereafter, as shown in FIG. 4K, an electroplating of a solder having a composition of 6 tin/4 lead was performed using AS 513 type bath (trade name, Ishihara Yakuhin Co., Ltd.), thereby forming a solder bump 29a having a thickness of 50 μm and a solder metal layer 29b having a thickness of 40 μm on both sides of the copper foil 21, respectively. Then, as shown in FIG. 4L, the photosensitive dry film 27 was removed. The remover employed in this case was a 3 wt % aqueous solution of NaOH 45° C. in liquid temperature. Thereafter, as shown in FIG. 4M, the copper foil 21 was etched using an alkaline etchant with the solder pattern 26a being employed as an etching resist, thereby forming a desired tape carrier.

Figure 4M:
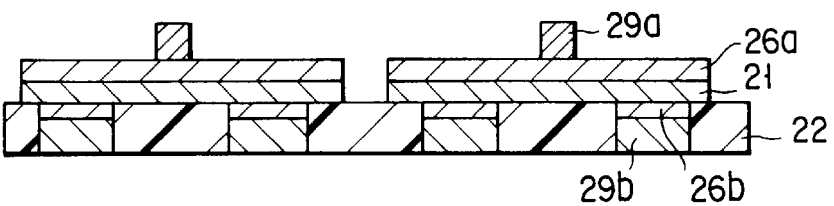
Figure 4N:
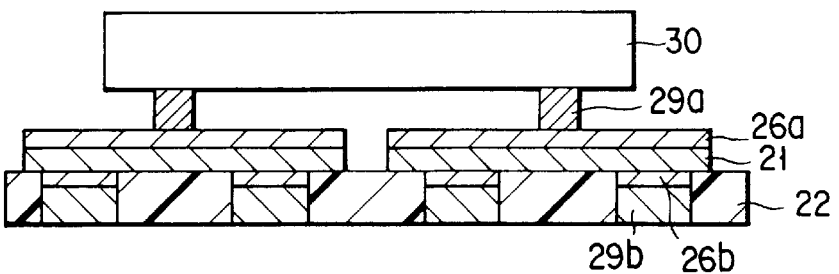
Figure 4D:
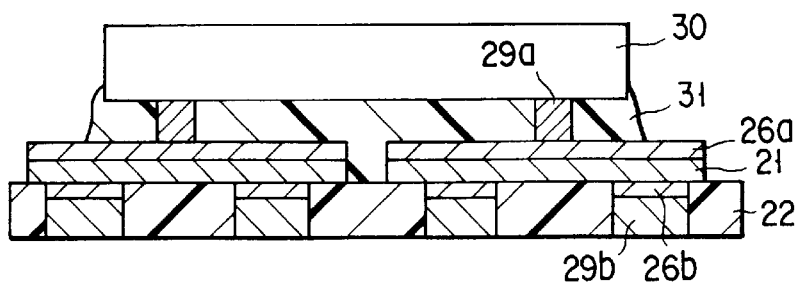

Thereafter, as shown in FIG. 4N, a semiconductor chip 30 which had been prepared in advance was mounted on the resultant tape carrier shown in FIG. 4M. The semiconductor chip 30 was provided on the peripheral portion thereof with aluminum pads, the surfaces of which were covered by an electroless plating layer of Ni/Au.

Further, as shown in FIG. 4O, the gap between the semiconductor chip 30 and the tape carrier was charged with a thermosetting resin such as epoxy resin 31 thereby completing a bonded structure comprising the tape carrier and the semiconductor chip 30.

According to the aforementioned manufacturing steps, it is possible to mount en bloc a semiconductor chip having aluminum pads covered with an Ni/Au layer which is capable of alloying with a solder bump on a tape carrier provided on the copper pattern side thereof with the solder bumps 29a by a sequential process comprising the steps of alignment/mounting of a semiconductor chip/reflow heating, etc.

After the semiconductor chips are mounted on a tape carrier in this manner, the tape carrier is cut off to obtain individual semiconductor devices.

As explained above, according to the first manufacturing method of a metal bump-attached tape carrier by making use of a solder masking method, it is possible to easily obtain a metal bump-attached tape carrier with each metal bump being formed of a columnar body having a side wall substantially perpendicular to the conductor pattern. Further, since it is designed such that the metal bumps are formed not on a substrate which has been accomplished but on a substrate which is being processed, the formation of the metal bumps can be easily performed.

In the foregoing explanations, this invention has been explained with reference to one example where a metal bump-attached tape carrier which has been manufactured by making use of a solder masking method is employed. In the following explanations however, a second manufacturing method of metal bump-attached tape carrier where an electro-deposited photoresist is utilized (an electro-deposited photoresist method) will be set forth.

Figure 5A:
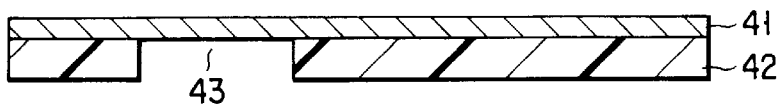
FIGS. 5A to 5K are cross-sectional views illustrating, in sequence, a process of manufacturing a metal bump-attached tape carrier according to another example of this invention.

First of all, as shown in FIG. 5A, a material comprising a copper foil 41 having a thickness of 18 μm and a polyimide layer 42 having a thickness of 40 μm and superimposed on the copper foil 41 was prepared. Then, holes 43 each having a diameter of 300 μm and a depth reaching to the surface of the copper foil 41 was formed by means of a carbon dioxide laser at the portions of the polyimide layer 42 where the connecting electrode was to be formed. The carbon that had been adhered to the hole 43 and the vicinity thereof at the occasion of forming the hole 43 was removed mechanically by means of blast treatment.

Figure 5B:
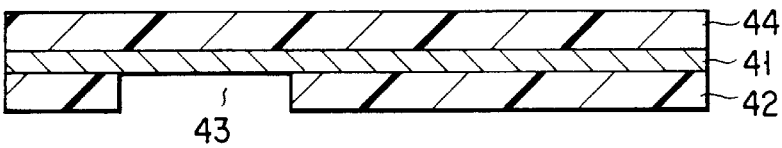
Figure 5C:
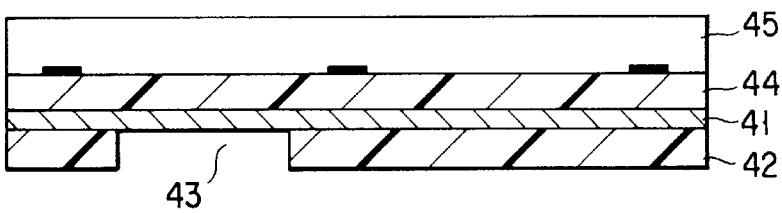

Then, after a negative photosensitive dry film 44 having a thickness of 50 μm was laminated on the copper foil as shown in FIG. 5B, the photosensitive dry film 44 was exposed to light through a mask 45 so as to form a positive pattern to be employed as a metal bump portion as shown in FIG. 5C. In this case, an ultra-high pressure mercury lamp was employed as an exposure light source, the exposure dose thereof being set to 160 mJ/cm$^2$.

Figure 5D:
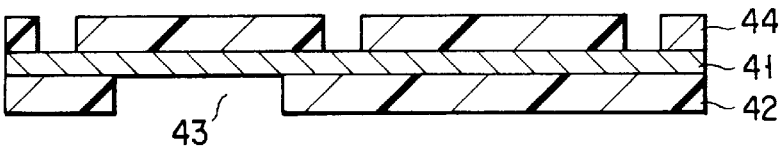

Then, as shown in FIG. 5D, the resultant photosensitive dry film 44 was developed using a 1 wt % aqueous solution of $Na_2CO_3$ 30° C. in liquid temperature thereby to form a plated resist pattern 44.

Figure 5E:
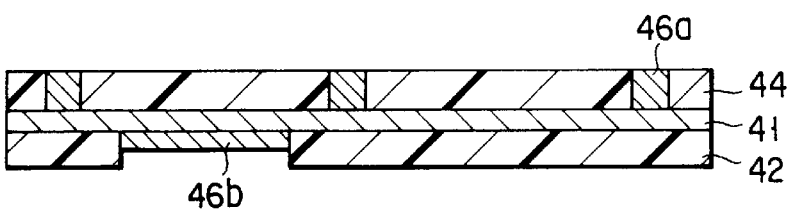

Thereafter, as shown in FIG. 5E, an electroplating of a solder having a composition of 6 tin/4 lead was performed, thereby forming a solder metal bump 46a having a height of 50 μm and a solder metal layer 46b having a thickness of 40 μm on both sides of the copper foil 41, respectively. The plating bath employed in this case was AS 513 type bath (trade name, Ishihara Yakuhin Co., Ltd.).

Figure 5F:
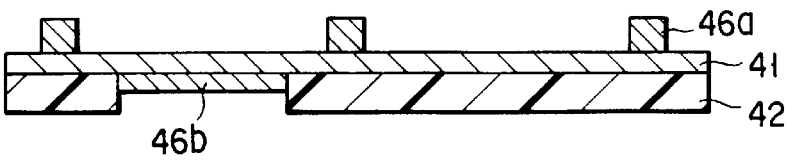
Figure 5G:
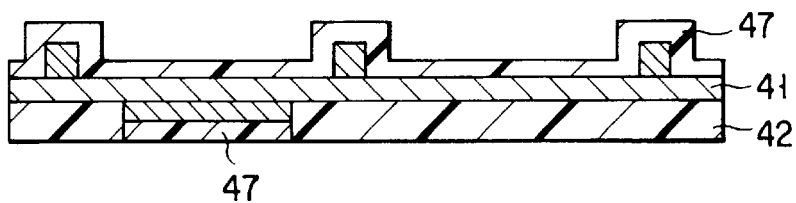

Then, as shown in FIG. 5F, the photosensitive dry film 44 was removed. The remover employed in this case was a 3 wt % aqueous solution of NaOH measuring 45° C. in liquid temperature. Thereafter, as shown in FIG. 5G, for the purpose of forming a circuit on the copper foil 41, an electro-deposited photoresist 47 (Prime coat AN-300; Kansai Paint Co., Ltd.) was electro-deposited all over the upper conductive surface of the copper foil 41. Then, this deposited photoresist 47 was dried at a temperature of 80° C. for 10 minutes.

Figure 5H:
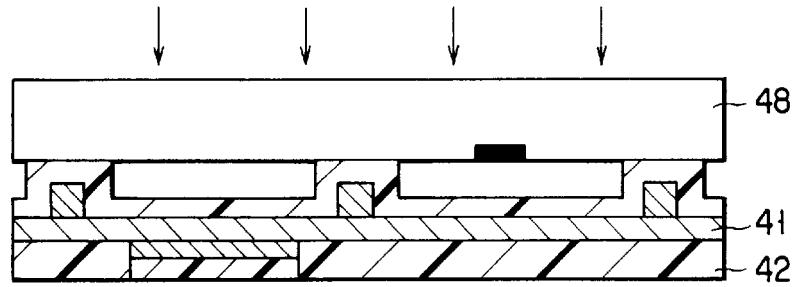

Subsequently, as shown in FIG. 5H, the electro-deposited photoresist 47 was exposed to light through a mask 48 so as to form a negative pattern to be employed as a conductor circuit. In this case, an ultra-high pressure mercury lamp was employed as an exposure light source, the exposure dose thereof being set to 100 mJ/cm$^2$.

Figure 5I:
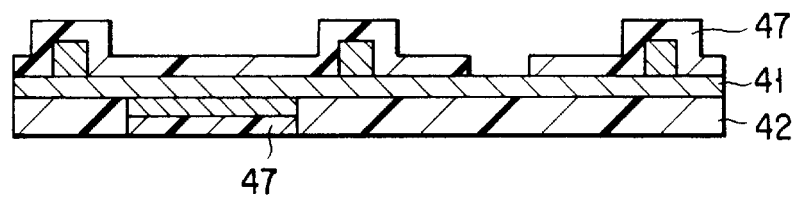
Figure 5J:
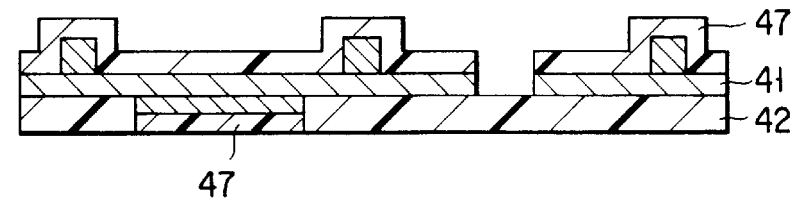

Then, as shown in FIG. 5I, the resultant electro-deposited photoresist 47 was developed using a 1 wt % aqueous solution of $Na_2CO_3$ 30° C. in liquid temperature thereby forming an electro-deposited photoresist pattern. Thereafter, as shown in FIG. 5J, the exposed portion of the copper foil 41 was etched by making use of an alkaline etching solution with the aforementioned electro-deposited photoresist pattern being employed as a mask, thereby obtaining a circuit pattern.

Figure 5K:
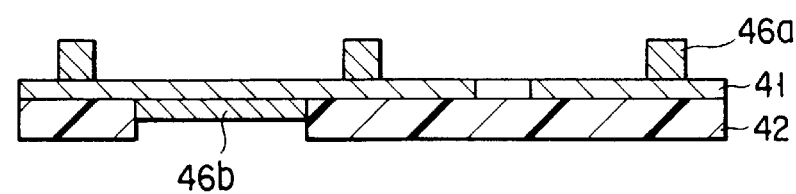

Then, the electro-deposited photoresist pattern was removed using a 3 wt % aqueous solution of NaOH measuring 45° C. in liquid temperature, thereby obtaining a desired metal bump-attached tape carrier as shown in FIG. 5K.

Figure 6:
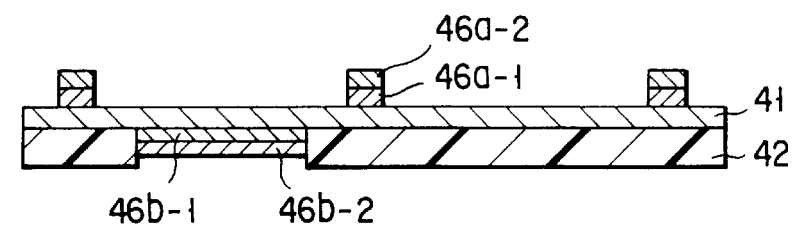
FIG. 6 is a cross-sectional view illustrating a metal bump-attached tape carrier according to another example of this invention.

FIG. 6 shows another example of a bump-attached tape carrier which was prepared in the same manner as that illustrated in the steps of FIGS. 5A to 5K except that the electroplating in the step shown in FIG. SE was performed in two steps, i.e. a first step of plating Cu and a second step of plating a solder, thereby forming a metal bump and a solder metal layer each consisting of a lower Cu layer and an upper solder layer. In FIG. 6, the layers indicated by 46a-1 and 46b-1 are formed of Cu, while the layers indicated by 46a-2 and 46b-2 are formed of a solder of 60 lead/40 tin.

As explained above, according to the method of manufacturing a metal bump-attached tape carrier by making use of the aforementioned electro-deposited photoresist method, it is possible to obtain a metal bump-attached tape carrier with each metal bump being formed of a columnar body having a side wall substantially perpendicular to the conductor pattern by making use of a more simplified manufacturing process as compared with the above-mentioned manufacturing method of a metal bump-attached tape carrier where the solder masking method is employed.

The metal bump-attached tape carrier and the manufacturing method thereof according to this invention are advantageous in the aspects as explained below.

As explained above, if the shape of the metal bump is spherical, the diameter of the metal bump becomes larger than the width of the conductor pad located at the metal bump. Therefore, when the pitch of the metal bumps is densified, a solder bridge may be formed between the neighboring bumps. Further, when the distance between the neighboring bumps becomes smaller, the charging of an under-fill resin may be deteriorated, thus deteriorating the yield and inviting an increase in manufacturing cost.

By contrast, in the case of the tape carrier of this invention, since the metal bump is columnar in configuration, any widthwise expansion of the metal bump can be prevented, thereby making it possible to obviate the aforementioned problems and hence to shorten the pitch of the metal bumps.

Additionally, there has been a possibility that due to a stress to be brought about by a difference in linear expansion coefficient between a circuit substrate and a semiconductor device, the bonded electrode portion may be ultimately fractured in a heat cycle test.

However, in the case of the tape carrier of this invention, since both of the metal bump and the metal layer of the bonded electrode portion can be formed into a multi-layer structure where the uppermost layer is constituted by a solder and the underlying layer is constituted by a metal having a higher melting point than that of the solder, it is possible to prevent the underlying layer from being fused due to a heat on the occasion of mounting a semiconductor device on a circuit substrate thereby connecting it with the circuit of the circuit substrate. As a result, it is possible to assure a sufficient thickness of the connecting electrode portion, thereby making it possible to improve the mechanical strength of the connecting electrode portion, and hence to extend the life to fracture of the connecting electrode portion.

When the metal bump portion is constituted by an uppermost layer consisting of a solder for bonding it with a semiconductor chip and by an underlying layer consisting of a high melting point metal which cannot be fused by heat for bonding the solder to the semiconductor chip, this high melting point metal functions as a spacer thereby making it possible to ensure a sufficient space between the semiconductor chip and the conductor pattern. As a result, it is possible to improve the filling performance of an under-fill resin thereby to assure the reliability of the bonded portion of the metal bump.

When an electroplating method is employed in the manufacturing method of the bump-attached tape carrier according to this invention, it is possible to form these metal bumps and a metal layer covering the connecting electrodes in such a manner as to have the same structure to each other and in the same step.

The manufacturing method of the bump-attached tape carrier according to this invention is featured in that the metal bumps are formed prior to the formation of a conductor pattern by means of etching.

As a method of forming metal bumps on a tape carrier on which a conductor pattern has been already formed, there is known a method wherein a feeder pattern for electroplating is preliminarily formed on the tape carrier, and then the metal bumps are formed via this feeder pattern on the tape carrier by means of electroplating, the feeder pattern being subsequently cut off. However, this method is accompanied with the problems that it is frequently difficult, depending on the shape of the conductor pattern, to form such a feeder pattern, and that an additional step of cutting the feeder pattern is required.

As a method of forming metal bumps on a tape carrier on which a conductor pattern has been already formed, there is also known a method wherein a cream solder or a solder ball is mounted on the portions of a conductor pattern where the metal bumps are to be formed, and then brazing the cream solder or the solder ball thereon. However, this method is accompanied with the problems that a solder resist layer is required to be formed on the tape carrier in order to prevent the solder from spreading over the conductor pattern, and that it is difficult to form the metal bumps at narrow intervals since the solder bumps formed in this manner are spherical in configuration as mentioned above.

By contrast, according to the manufacturing method of metal bump-attached tape carrier of this invention, since the metal bumps are formed prior to the formation of a conductor pattern by means of etching, the feeder pattern for electroplating is no more required to be formed. Moreover, since the metal bumps are formed not by means of brazing but by means of electroplating method, the aforementioned solder resist layer for preventing the solder from spreading over the conductor pattern is no more required to be formed on the tape carrier. Therefore, it is possible according to the method of this invention to simplify the manufacturing process of the metal bump-attached tape carrier and to easily form columnar metal bumps.

Next, the method of manufacturing a semiconductor device involving a process of bonding a semiconductor chip onto a tape carrier will be explained as follows.

In this case, the semiconductor chip is bonded onto the bump-attached tape carrier shown in FIG. 2. The following are two different methods of achieving this bonding.

Figure 7A:
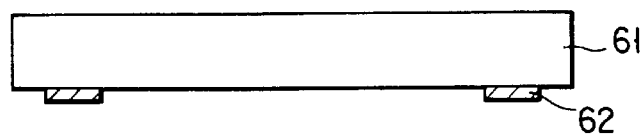
FIGS. 7A to 7E are cross-sectional views illustrating, in sequence, a process of bonding a semiconductor chip to a tape carrier according to a first method.

FIGS. 7A to 7E are cross-sectional views illustrating, in sequence, a process of bonding a semiconductor chip to a tape carrier according to a first method. First of all, a semiconductor chip 61 as shown in FIG. 7A was prepared. This semiconductor chip 61 was provided on the peripheral portion thereof with electrodes 62, each constituted by an aluminum pad whose surface was covered by an electroless plating layer of Ni/Au. Then, a flux is coated on the surface of the electrodes 62. Alternatively, this flux may be coated all over the surface where the electrodes of the semiconductor chip were formed. As for the flux, those having a low viscosity such as F-50F (Harima Kasei Co., Ltd.) may be employed.

Figure 7B:
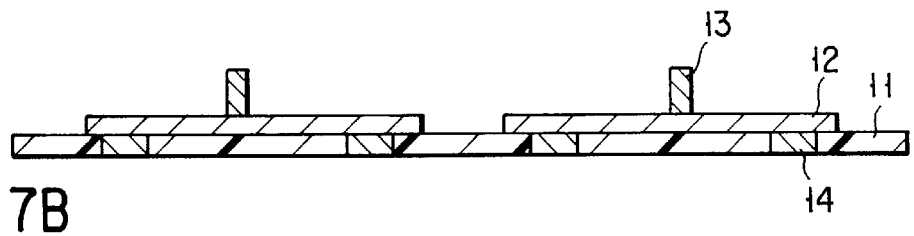
Figure 7C:
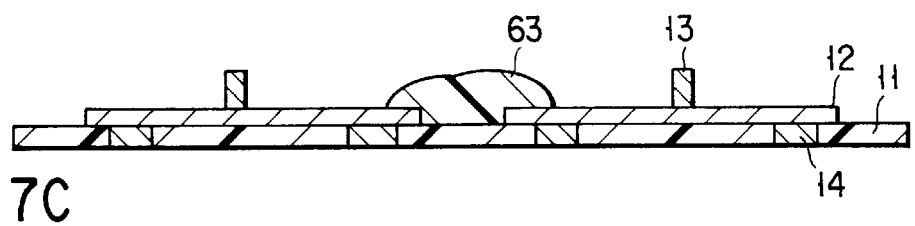
Figure 7D:
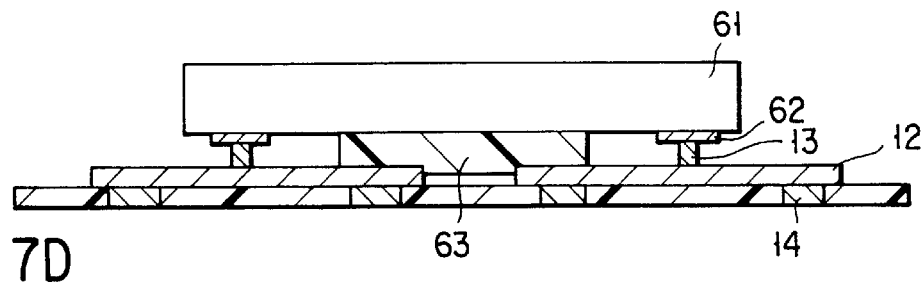
Figure 7E:
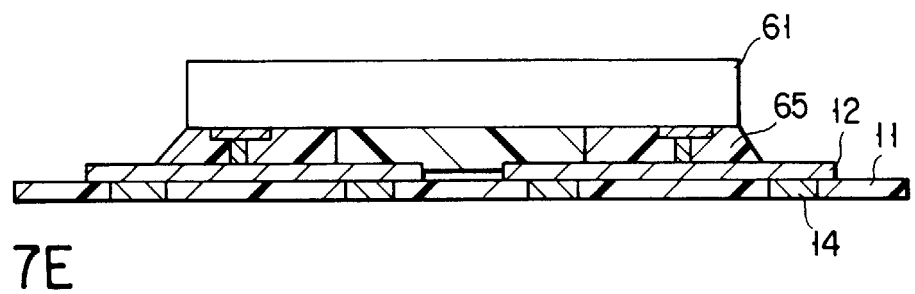

On the other hand, a bump-attached tape carrier as shown in FIG. 7B was prepared. This bump-attached tape carrier was constructed as shown in FIG. 2.

A fixing material 63 was fed from a dispenser to the central portion of the tape carrier, and then the semiconductor chip 61 as shown in FIG. 7A was mounted on the fixing material 63. At this step of mounting the semiconductor chip 61, the metal bumps 13 of the tape carrier was aligned with the electrodes 62 of the semiconductor chip 61. The resultant assembled body was heated in a heating furnace at a temperature of 150° C. for 10 minutes thereby to cure the fixing material 63, thus fixing the semiconductor chip 61 to the surface of the tape carrier. As for the fixing material 63, EH-0515L8 (HYSOL Co., Ltd.) was employed.

Subsequently to this fixing step, the assembled body was heated in a heating furnace at a temperature of 230° C. for one minute thereby to perform a reflow heating, thus bonding the electrodes 62 to the metal bumps 13.

With respect to the method of heating in this case, a press-heating may be applied, making use of a heating tool, to the surface of the fixed semiconductor chip.

Finally, an under-fill resin comprising a thermosetting resin 65 such as epoxy resin was charged into the space formed between the semiconductor chip 61 and the tape carrier, thus obtaining a semiconductor device (a semiconductor package) comprising the semiconductor chip mounted on the tape carrier.

By the way, the coating of flux on the occasion of bonding a semiconductor chip to the tape carrier may be applied exclusively to the top surface of the metal bumps of the tape carrier instead of applying it on the surface of the electrodes of the semiconductor chip. The coating of flux onto only the top surface of the metal bumps may be performed by means of a transferring method wherein a plastic sheet coated with a flux is contacted with the surface of the tape carrier where the metal bumps are formed thereby to transfer the flux onto only the top surface of the metal bumps.

Since a flux was not coated on the surface of the copper (conductor) pattern in the step of bonding a semiconductor chip to the tape carrier according to the aforementioned first method, the outflow of solder over the surface of the copper pattern in the process of reflow heating could be prevented even if the copper pattern was not protected with a solder resist, so that it was possible to prevent the generation of undesirable phenomena such as the shortening of the interval between the semiconductor chip and the tape carrier, or the bonding failure. Further, since the semiconductor chip was fixed to the tape carrier by making use of a fixing material, the shortening of interval between the semiconductor chip and the tape carrier could be prevented, and at the same time, an excellent bonding without misregistration between the semiconductor chip and the tape carrier could be achieved even if a liquid flux of low solid matter content was thinly coated on the electrodes of the semiconductor chip or on the top surface of the metal bumps of the tape carrier.

Figure 8A:
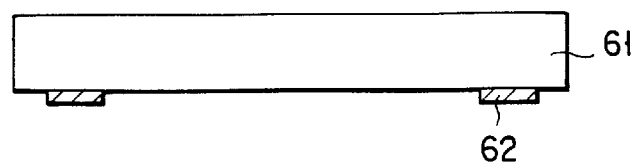
FIGS. 8A to 8D are cross-sectional views illustrating, in sequence, a process of bonding a semiconductor chip to a tape carrier according to a second method.

Next, the bonding of a semiconductor chip onto the tape carrier according to a second method will be explained. FIGS. 8A to 8D are cross-sectional views illustrating, in sequence, a process of bonding a semiconductor chip to a tape carrier according to the second method. First of all, a semiconductor chip 61 as shown in FIG. 8A was prepared. This semiconductor chip 61 was provided on the peripheral portion thereof with electrodes 62, each constituted by an aluminum pad whose surface was covered by an electroless plating layer of Ni/Au as in the case of the aforementioned first method shown in FIGS. 7A to 7E.

Then, in the same manner as in the aforementioned first method, a flux is coated on the surface of the electrodes 62. As for the flux, those having a low viscosity such as F-50F (Harima Kasei Co., Ltd.) may be preferably employed.

Figure 8B:
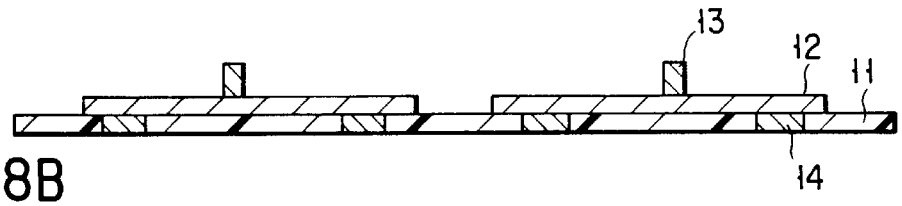

On the other hand, a bump-attached tape carrier as shown in FIG. 8B was prepared. This bump-attached tape carrier was also constructed as shown in FIG. 2.

Figure 8C:
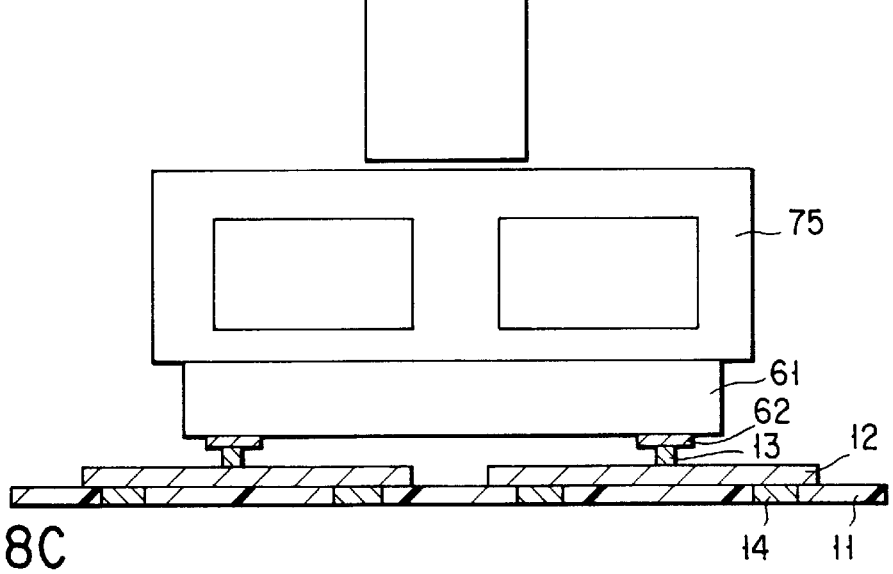
Figure 8D:
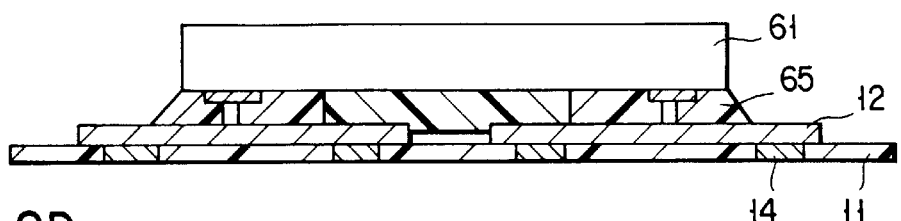

Thereafter, the semiconductor chip was positioned such that the electrodes of the semiconductor chip agreed with the metal bumps of the tape carrier, and then as shown in FIG. 8C, a heating tool 75 was placed on the surface of the semiconductor chip 61 thereby to heat the semiconductor chip 61 while suitably pressing the semiconductor chip 61. The temperature of the heating tool 75 at this occasion was 230° C. and the heating time was one minute. The magnitude of the pressing force was controlled such that a suitable distance could be maintained between the semiconductor chip and the tape carrier so as not to completely collapse the metal bumps. As a result, the metal bumps 13 could be fused and bonded to the electrodes 62.

Finally, an under-fill resin comprising a thermosetting resin 65 such as epoxy resin was charged into the space formed between the semiconductor chip 61 and the tape carrier, thus obtaining a semiconductor device (a semiconductor package) comprising the semiconductor chip mounted on the tape carrier.

By the way, the coating of flux at the occasion of bonding a semiconductor chip to the tape carrier may be applied, as in the case of the aforementioned first method, exclusively to the top surface of the metal bumps of the tape carrier instead of applying it on the surface of the electrodes of the semiconductor chip.

The bonding process of a semiconductor chip to the tape carrier according to the aforementioned second method leads to not only the same advantages as those of the aforementioned first method, but also the following additional advantages. Namely, a semiconductor chip can be accurately bonded to the tape carrier without generating a misregistration even if the fixing by making use of a fixing material is not performed. Furthermore, by suitably selecting the pressing force onto the semiconductor chip, a warp of the tape carrier can be avoided thereby making it possible to prevent the generation of bonding failure due to the warp, and at the same time, the semiconductor chip can be maintained parallel with the tape carrier.

As explained above, since the metal bump is constituted by a columnar body having a side wall substantially perpendicular to the surface of the conductor pattern according to this invention, it is now possible to obviate the formation of solder bridge on the occasion of mounting a semiconductor chip on the tape carrier as seen in the case of the conventional spherical bump, and at the same time, it is possible to easily perform the filling of an under-fill resin.

Further, since the coating of flux is selectively applied to the surface of electrodes of the semiconductor chip or to the top surface of metal bumps of the tape carrier on the occasion of mounting the semiconductor chip on the tape carrier, a possibility of causing a metal constituting the solder to flow over the conductor pattern of the tape carrier at the step of heat bonding can be prevented. Therefore, a possibility of generating bonding failure due to the lowering in height of the metal bumps can be minimized. Furthermore, since the bump-attached tape carrier is fixed to a semiconductor chip by making use of a fixing material at the occasion of mounting the semiconductor chip on the bump-attached tape carrier, the misregistration of the semiconductor chip can be avoided.

Furthermore, it is also possible to perform an accurate bonding between the bump-attached tape carrier and the semiconductor chip without allowing any misregistration between them by suitably heat-pressing the bump-attached tape carrier and the semiconductor chip to each other after the semiconductor chip is positioned in place on the bump-attached tape carrier, whereby the fixing of them by making use of a fixing material can be omitted.

When this pressing force is suitably selected, a warp of the tape carrier can be avoided, thus preventing the generation of bonding failure due to the warp, and at the same time, the semiconductor chip can be kept parallel with the tape carrier.

We claim:

1. A method of manufacturing a bump-attached tape carrier, which comprises the steps of;
    forming a first photosensitive resin layer on a metal foil of a laminate body comprising an insulating film and the metal foil;
    forming a first resin pattern for forming a circuit by performing a patterning of said first photosensitive resin layer;
    forming a metallic pattern on said metal foil exposed out of said first resin pattern by performing a first electroplating;
    forming a second photosensitive resin layer onto an overall surface including said metal pattern after removing said first resin pattern;
    forming a second resin pattern for forming metal bumps by performing a patterning of said second photosensitive resin layer;
    forming said metal bumps on said metallic pattern exposed out of said second resin pattern by performing a second electroplating;
    removing said second resin pattern; and
    forming a metal foil pattern by selectively removing said metal foil with said metallic pattern being employed as a mask.

2. The method according to claim 1, which further comprises a step of forming a hole in said insulating film prior to the step of forming said first photosensitive resin layer, said hole being smaller in diameter than that of a terminal of said conductor pattern.

3. The method according to claim 2, wherein a first metal layer is formed on the metal foil exposed in said hole by making use of said first electroplating, while a second metal layer is formed on the first metal layer exposed in said hole by making use of said second electroplating.

4. The method according to claim 1, which further comprises a step of forming a hole in said insulating film after the step of forming said metal pattern but prior to the step of forming said metal bumps, said hole being smaller in diameter than that of a terminal of said conductor pattern.

5. The method according to claim 4, wherein a metal layer is formed on the metal foil exposed in said hole by making use of said second electroplating.

6. The method according to claim 1, wherein said metal bumps are formed of a solder.

7. A method of manufacturing a bump-attached tape carrier, which comprises the steps of;
    forming a first photosensitive resin layer on a metal foil of a laminate body comprising an insulating film and the metal foil;
    forming a first resin pattern for forming metal bumps by performing a patterning of said first photosensitive resin layer;
    forming metal bumps on said metal foil exposed out of said first resin pattern by performing an electroplating;
    forming a second photosensitive resin layer all over a surface including said metal bumps by means of electrodeposition process after removing said first resin pattern;
    forming a second resin pattern for forming a circuit by performing a patterning of said second photosensitive resin layer; and
    forming a metal foil pattern by selectively removing said metal foil with said second resin pattern being employed as a mask.

8. The method according to claim 7, which further comprises a step of forming a hole in said insulating film prior to the step of forming said first photosensitive resin layer, said hole being smaller in diameter than that of a terminal of said conductor pattern.

9. The method according to claim 8, wherein a metal layer is formed on the metal foil exposed in said hole by making use of said electroplating.

10. The method according to claim 7, wherein said metal bumps are formed of a solder.

11. A method of manufacturing a semiconductor device by bonding a semiconductor chip to a bump-attached tape carrier;
    said bump-attached tape carrier comprising an insulating film, a conductor pattern formed on the insulating film, and metal bumps formed on the conductor pattern and adapted to be bonded with said semiconductor chip; said metal bumps being respectively formed of a columnar body having a side wall substantially perpendicular to said conductor pattern; and said method comprising the steps of;

coating a flux on a surface of each electrode of said semiconductor chip or a top surface of each of said metal bumps;

aligning said semiconductor chip with said tape carrier so as to set each electrode of said semiconductor chip in accordance with each of the metal bumps of said tape carrier;

fixing said semiconductor chip to said tape carrier by means of a fixing material; and connecting each electrode of said semiconductor chip with each of the metal bumps of said tape carrier by heat-fusing the metal bumps of said tape carrier.

12. The method according to claim 11, wherein said heat-fusing is performed by heating a surface of said semiconductor chip which is opposite to the surface thereof where said electrodes are formed by means of a heating tool.

13. The method according to claim 11, wherein said heat-fusing is performed by passing said tape carrier having said semiconductor chip bonded thereto through a heating furnace.

14. The method according to claim 11, which further comprises a step of filling a space between said semiconductor chip and said tape carrier with a resin after said electrodes of semiconductor chip are connected with said metal bumps of tape carrier.

15. A method of manufacturing a semiconductor device by bonding a semiconductor chip to a bump-attached tape carrier;

said bump-attached tape carrier comprising an insulating film, a conductor pattern formed on the insulating film, and metal bumps formed on the conductor pattern and adapted to be bonded with said semiconductor chip; said metal bumps being respectively formed of a columnar body having a side wall substantially perpendicular to said conductor pattern; and said method comprising the steps of;

coating a flux on a surface of each electrode of said semiconductor chip or a top surface of each of said metal bumps;

aligning said semiconductor chip with said tape carrier so as to set each electrode of said semiconductor chip in accordance with each of the metal bumps of said tape carrier; and connecting each electrode of said semiconductor chip with each of the metal bumps of said tape carrier by heating a surface of said semiconductor chip which is opposite to the surface thereof where said electrodes are formed by means of a heating tool thereby fusing the metal bumps of said tape carrier.

16. The method according to claim 15, which further comprises a step of filling a space between said semiconductor chip and said tape carrier with a resin after said electrodes of semiconductor chip are connected with said metal bumps of tape carrier.

* * * * *